United States Patent
Doris et al.

(10) Patent No.: US 9,947,743 B2
(45) Date of Patent: Apr. 17, 2018

(54) STRUCTURES AND METHODS FOR LONG-CHANNEL DEVICES IN NANOSHEET TECHNOLOGY

(71) Applicant: International Business Machines Corporation, Armonk, NY (US)

(72) Inventors: Bruce B. Doris, Slingerlands, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/184,520

(22) Filed: Jun. 16, 2016

(65) Prior Publication Data

US 2017/0365661 A1    Dec. 21, 2017

(51) Int. Cl.
    *H01L 29/788* (2006.01)
    *H01L 29/06* (2006.01)
    *H01L 29/66* (2006.01)
    *H01L 29/423* (2006.01)
    *H01L 29/786* (2006.01)

(52) U.S. Cl.
    CPC ...... *H01L 29/0673* (2013.01); *H01L 29/4236* (2013.01); *H01L 29/42392* (2013.01); *H01L 29/6656* (2013.01); *H01L 29/66545* (2013.01); *H01L 29/66666* (2013.01); *H01L 29/78642* (2013.01)

(58) Field of Classification Search
    USPC ...................................................... 257/330
    See application file for complete search history.

(56) References Cited

U.S. PATENT DOCUMENTS

| 7,932,543 | B2 | 4/2011 | Choi et al. |
| 8,536,563 | B2 | 9/2013 | Bangsaruntip et al. |
| 8,999,851 | B2 | 4/2015 | Leon et al. |
| 2010/0255303 | A1 | 10/2010 | Wardle et al. |
| 2013/0285149 | A1 | 10/2013 | Fonash et al. |
| 2017/0062598 | A1* | 3/2017 | Seo ................. B82Y 10/00 |

FOREIGN PATENT DOCUMENTS

CN    1466214 A    1/2004

OTHER PUBLICATIONS

English Translation of CN1466214A by Jigang Zhao et al., Jan. 7, 2004.

* cited by examiner

*Primary Examiner* — Timor Karimy
(74) *Attorney, Agent, or Firm* — Jennifer R. Davis; Michael J. Chang, LLC

(57) ABSTRACT

Techniques for providing supporting structures for suspended nanosheets/wires in long-channel devices are provided. In one aspect, a method of forming a device structure includes: forming a series of alternating active and sacrificial layers as a stack on a substrate; patterning at least one feature through each of the active and sacrificial layers in the stack; filling the feature with a fill material that is resistant to etching performed on the sacrificial layers; and etching the sacrificial layers to selectively remove at least a portion of each of the sacrificial layers from the stack thereby suspending the active layers, wherein following the etching the fill material remains as a structure supporting the suspended active layers. Transistor devices and methods for formation thereof are also provided.

19 Claims, 9 Drawing Sheets

Top-down

Cross-section A-A'

Cross-section B-B'

Top-down

Cross-section C-C'

STRUCTURES AND METHODS FOR LONG-CHANNEL DEVICES IN NANOSHEET TECHNOLOGY

FIELD OF THE INVENTION

The present invention relates to long-channel devices in nanosheet technology, and more particularly, to techniques for providing supporting structures for suspended nanosheets/wires in long-channel devices.

BACKGROUND OF THE INVENTION

Nanosheets (or nanowires) are formed by selectively etching material from between the sheets/wires. When the span of the nanosheets or nanowires is long (such as in the case of long-channel devices) the sheets/wires can sag, reducing the vertical sheet-to-sheet or wire-to-wire spacing, and even potentially causing them to touch one another.

Therefore, techniques to counteract sagging in such devices would be desirable.

SUMMARY OF THE INVENTION

The present invention provides techniques for providing supporting structures for suspended nanosheets/wires in long-channel devices. In one aspect of the invention, a method of forming a device structure is provided. The method includes: forming a series of alternating active and sacrificial layers as a stack on a substrate; patterning at least one feature through each of the active and sacrificial layers in the stack; filling the feature with a fill material that is resistant to etching performed on the sacrificial layers; and etching the sacrificial layers to selectively remove at least a portion of each of the sacrificial layers from the stack thereby suspending the active layers, wherein following the etching the fill material remains as a structure supporting the suspended active layers.

In another aspect of the invention, a method of forming a transistor device is provided. The method includes: forming a series of alternating active and sacrificial layers as a stack on a substrate; patterning at least one feature through each of the active and sacrificial layers in the stack; filling the feature with a fill material that is resistant to etching performed on the sacrificial layers; forming a dummy gate over a portion of the stack that serves as a channel region of the transistor device; forming source and drain regions on opposite sides of the dummy gate; burying the dummy gate in a gap fill dielectric; removing the dummy gate forming a gate trench in the gap fill dielectric; etching the sacrificial layers to selectively remove a portion of each of the sacrificial layers from the stack within the gate trench thereby suspending the active layers in the channel region of the transistor device, wherein following the etching the fill material remains as a structure supporting the suspended active layers in the gate trench; and forming a replacement gate in the gate trench.

In yet another aspect of the invention, a transistor device is provided. The transistor device includes: a stack of active layers spanning source and drain regions of the transistor device in a channel region of the transistor device; at least one support structure supporting each of the active layers in the channel region of the transistor device; and a gate surrounding a portion of each of the active layers in the channel region of the transistor device.

A more complete understanding of the present invention, as well as further features and advantages of the present invention, will be obtained by reference to the following detailed description and drawings.

DETAILED DESCRIPTION OF PREFERRED EMBODIMENTS

Figure 1:
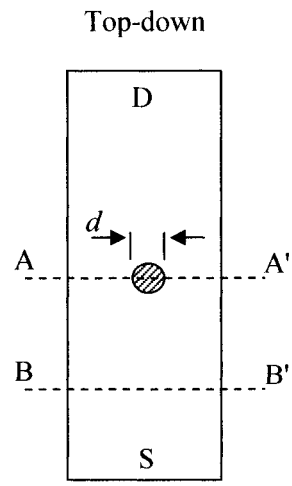
FIG. 1 is a diagram illustrating a top-down view of a pinhole structure for supporting nanosheets/wires in a stack according to an embodiment of the present invention.

As highlighted above, when nanosheets or nanowires span over long distances (as is the case, e.g., with long channel devices) the nanosheets/nanowires can sag. Sagging reduces (vertically) the distance between the sheets/wires. If the sagging is severe, the sheets/wires can even undesirably touch one another. Advantageously, provided herein are techniques for counteracting this sagging problem by providing pedestal regions below the suspended sheets/wires for support. These pedestal regions can have various different configurations (see below), all of which have a minimal impact, if any, to the device characteristics.

Reference is made herein to long and short channel devices. As is known in the art, a short channel device is a transistor in which the channel length is on the same order of magnitude as the depletion-layer widths of the source and drain junctions, and a long channel device is a transistor with a sufficiently large enough length and width that edge effects can be neglected. Long-channel devices may be commonly used for analog applications, and in conjunction with thicker gate dielectric, long-channel devices may also be used to support larger voltages for input-output functions, for example. In the case of suspended nanosheets, long-channel devices may also be defined as those in which mechanical sagging becomes problematic. By way of example only, devices with a channel length of less than 100 nanometers (nm) may be considered herein as short channel devices, and those with channel lengths greater than 100 nm may be considered to be long channel devices.

Further, the term "nanosheet" (or also simply "sheet") refers herein to a sheet or layer having nanoscale dimensions. The terms "nanosheet" and "nanowire" (or also simply "wire") may be used interchangeably herein when referring to a particular structure. For instance, "nanosheet" can be used to refer to a nanowire with a larger width, and/or "nanowire" may be used to refer to a nanosheet with a smaller width, and vice versa.

As will be described in detail below, a number of different techniques are presented herein that can be used to provide support for the sheets/wires following release. One such method is referred to herein as the "pinhole method," and the other as the "I-beam method." During fabrication, a stack of sheets/wires is constructed with alternating layers of active channel and sacrificial layers on a substrate. By way of example only, in the following description silicon (Si) and silicon germanium (SiGe) are used as examples of the materials used to build such as stack. However, the goal is to be able to remove the sacrificial layers from the stack selective to the active channel layers. Therefore, any combination of materials can be employed where one can be removed from the stack selective to the other. With regard to the combination of Si and SiGe, either material can be the active channel material or the sacrificial material, it all depends on the etchant used to remove the sacrificial material. Thus, for instance, an Si-selective etchant can be used to remove a Si sacrificial material from an Si/SiGe stack, whereas a SiGe selective etchant can be used to remove a SiGe sacrificial material from a Si/SiGe stack.

Following removal of the sacrificial layers from in between portions of the active layers in the stack, the active layers are now suspended (i.e., the portions of the active layers that were once resting on an underlying sacrificial layer are now released from the stack). A portion of the sacrificial layers must remain in the stack at the ends of the active layer to maintain the stack. However, sagging can undesirably occur in the suspended portions of the active layers causing those suspended portions to move closer to one another, and in the worst case they can even touch.

Figure 2:
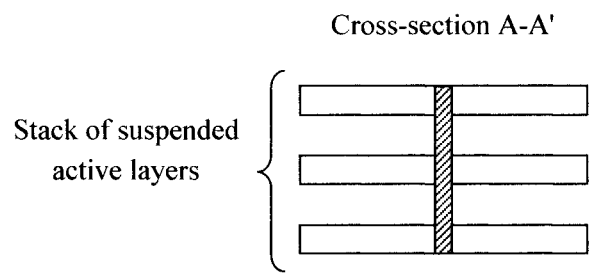
FIG. 2 is a diagram illustrating a cross-sectional view through the pinhole support structure of FIG. 1 according to an embodiment of the present invention.
Figure 3:
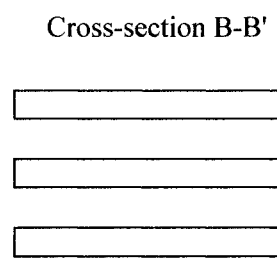
FIG. 3 is a diagram illustrating a cross-sectional view through the stack of FIG. 1 but not at the pinhole support structure according to an embodiment of the present invention.
Figure 4:
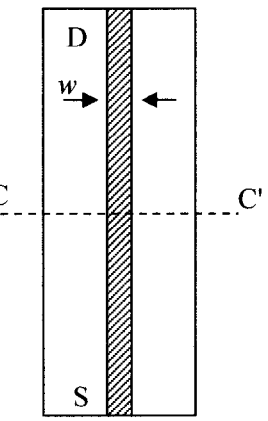
FIG. 4 is a diagram illustrating a top-down view of a beam structure for supporting nanosheets/wires in a stack according to an embodiment of the present invention.

With the above-mentioned pinhole method, prior to removing the sacrificial layers from the stack, at least one pinhole is made through the stack (i.e., through the active and sacrificial layers) and the pinhole is filled with a material that is different from the sacrificial material (namely a material that will not be affected during removal of the sacrificial material). The fill material will provide a pedestal (in the pinhole) that supports the suspended active layers in the stack. See, for example, FIG. 1 (top-down view), FIG. 2 (cross-section along A-A' of FIG. 1—through the pinhole), and FIG. 3 (cross-section along B-B' of FIG. 1—not at the pinhole). According to an exemplary embodiment, the pinhole has a diameter d of from about 5 nm to about 15 nm, and ranges therebetween. An exemplary embodiment will be described below where the stack is used in the formation of a transistor device where the active layers serve as channels between source (S) and drain (D) regions of the device. See FIG. 1 and FIG. 4 (described below).

In one exemplary embodiment, the pinhole is filled with the active material. For instance, in a Si/SiGe stack where Si is that active material (and SiGe is the sacrificial material), the pinhole can be filled with Si. Conversely, in a Si/SiGe stack where SiGe is that active material (and Si is the sacrificial material), the pinhole can be filled with SiGe. Advantageously, when the pinhole is filled with the active material it will not interrupt the current flow through the active layers, and thus control on the layer and pinhole dimensions is not as important. While the active layers in the stack are shorted at their ends (by the portions of the sacrificial material that remain in the stack—see above), use of an active material will however also provide a short in the middle of the active layers. Thus, in another exemplary embodiment, the pinhole is filled with an insulator (such as an oxide material) rather than an active material. However, with an insulator one must control the size of the pinhole/pedestal (i.e., it must remain a true pinhole/column) in order to prevent interrupting current flow through the active layers.

After the pinhole has been filled with the respective material, the sacrificial layers can be removed from the stack, releasing the active layers from the stack. The pinhole fill material will remain as a pedestal structure supporting the released active layers, thus preventing sagging.

Figure 5:
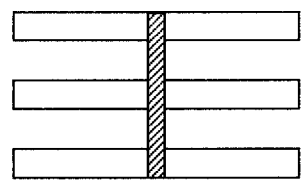
FIG. 5 is a diagram illustrating a cross-sectional view through the beam structure of FIG. 4 according to an embodiment of the present invention.

With the I-beam approach, a similar technique as above is employed except that the supporting pedestal is configured more as a beam than a column. See, for example, FIG. 4 (top-down view) and FIG. 5 (cross-section along C-C' of FIG. 4—through the beam). According to an exemplary embodiment, the beam has a width w of from about 5 nm to about 15 nm, and ranges therebetween. The beam too may be formed from the active material or from an insulator. However, with the I-beam approach using an insulator care must be taken not to interrupt the current flow in the active material between the source (S) and the drain (D). See below.

The present techniques are now described in detail by way of reference to FIGS. 6-14. The process begins by forming an alternating series of active and sacrificial layers as a stack on a substrate. For ease and clarity of description, these layers will be referred to as nanosheets however, as provided above, these layers can also constitute nanowires depending on their width.

Figure 6:
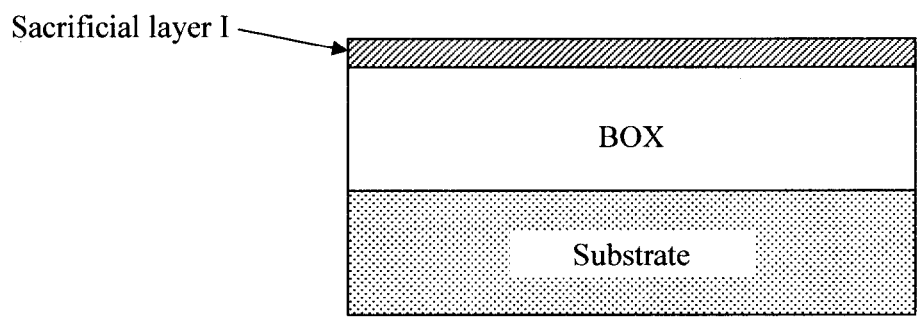
FIG. 6 is a cross-sectional diagram illustrating a starting structure for forming a nanosheet/wire stack which includes a first sacrificial layer separated from a substrate by a buried insulator (e.g., a buried oxide or BOX) according to an embodiment of the present invention.

According to an exemplary embodiment, as shown in FIG. 6 the stack can be constructed on a silicon-on-insulator (SOI) wafer. As is known in the art, an SOI wafer includes a SOI layer separated from a substrate by a buried insulator. When the buried insulator is an oxide, it is often referred to as a buried oxide or BOX (see FIG. 6).

As noted above, one suitable choice for the active and sacrificial materials can be Si and SiGe wherein either can serve as the active or sacrificial material for the other. Using a Si and SiGe stack as an example, when the sacrificial material is Si, for example, one can simply use the SOI layer as the first sacrificial layer (e.g., Sacrificial layer I in FIG. 6 is Si) and then add SiGe and Si layers alternately one on top of the other to form the stack. Alternatively, when the sacrificial material is SiGe, for example, one can use Ge condensation to convert the SOI layer to a SiGe-on-insulator (SGOI) layer (e.g., Sacrificial layer I in FIG. 6 is SiGe). Si and SiGe layers can then be added alternately one on top of the other to form the stack. An example of Ge condensation is described below. Thus, according to an exemplary embodiment, the Sacrificial layer I in FIG. 6 is either Si or SiGe.

Figure 7:
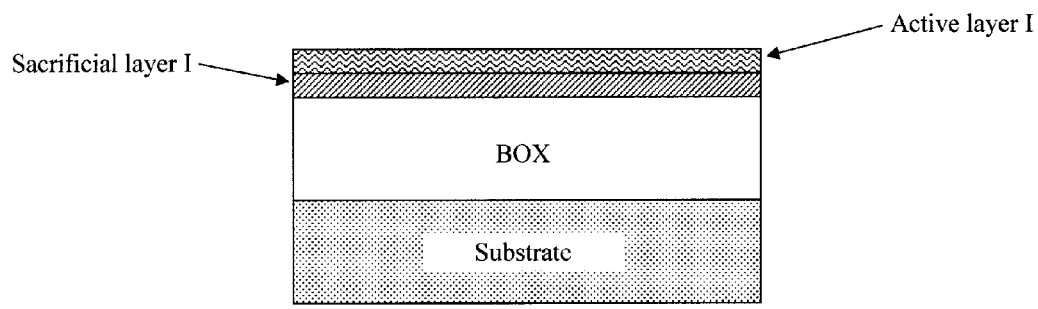
FIG. 7 is a cross-sectional diagram illustrating a first active channel layer having been formed on the first sacrificial layer according to an embodiment of the present invention.

Next, as shown in FIG. 7, a first active channel layer (Active layer I) is grown on Sacrificial layer I. An epitaxial growth process may be used to deposit the Si and SiGe layers in the stack. According to an exemplary embodiment, each of the active and sacrificial layers in the stack has a thickness of from about 5 nanometers (nm) to about 20 nm, and ranges therebetween.

Figure 8:
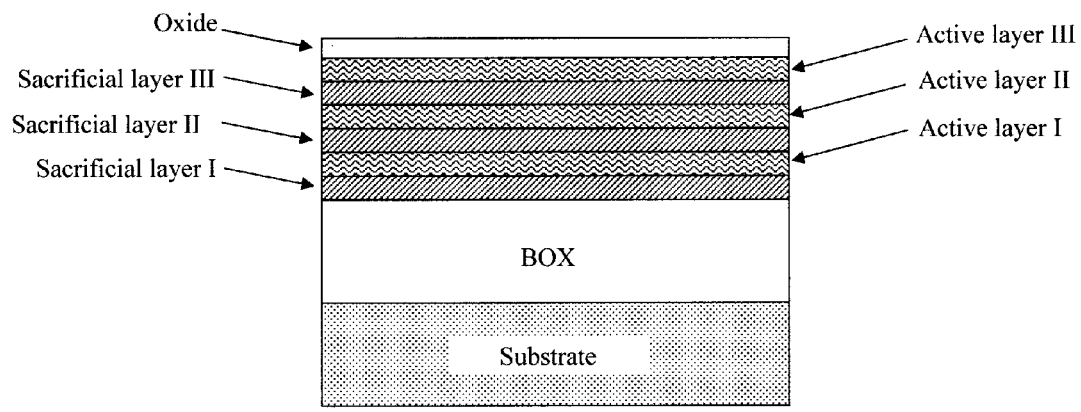
FIG. 8 is a cross-sectional diagram illustrating additional layers having been formed on the stack alternating between sacrificial and active channel materials according to an embodiment of the present invention.
Figure 9:
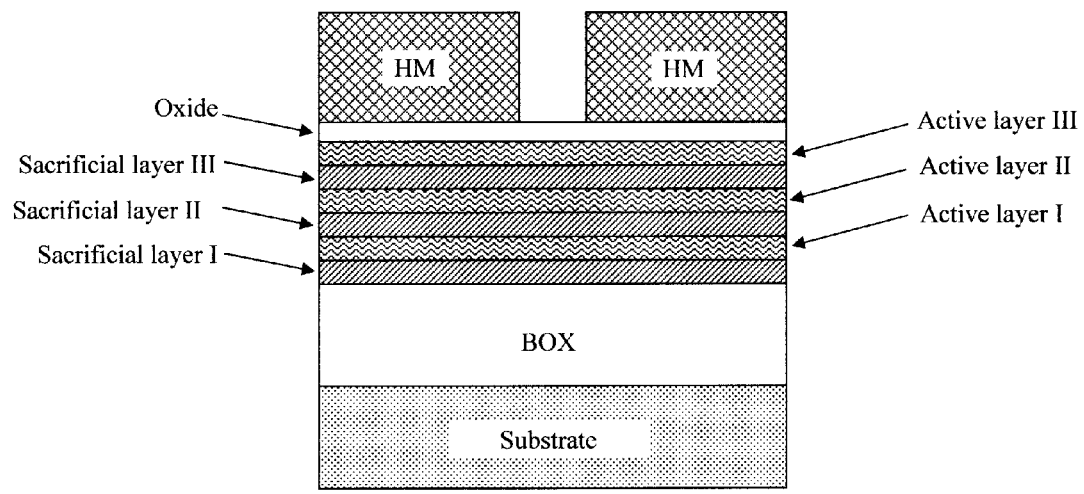
FIG. 9 is a cross-sectional diagram illustrating a patterned hardmask (HM) having been formed on the stack according to an embodiment of the present invention.
Figure 10:
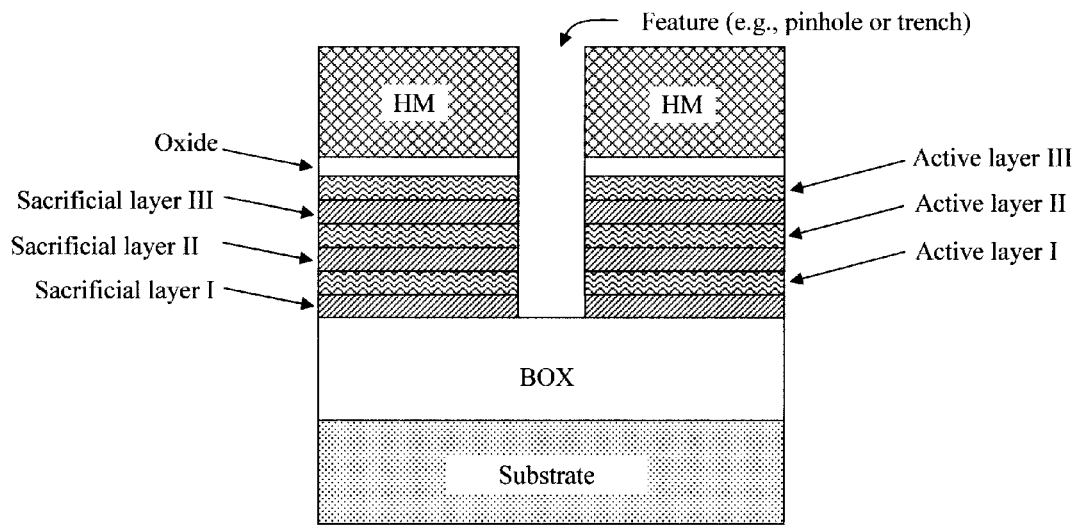
FIG. 10 is a cross-sectional diagram illustrating the patterned hardmask having been used to pattern at least one feature (e.g., pinhole or trench) in the stack according to an embodiment of the present invention.

As shown in FIG. 8, this process is repeated to form additional layers on the stack each time alternating between sacrificial and active channel materials. See FIG. 8 having additional sacrificial layers (i.e., Sacrificial layers II, III, etc.) and additional active layers (i.e., Active layers II, III, etc.). The result, according to an exemplary embodiment, is an alternating Si/SiGe stack with either of these materials being the active channel material and the other being the sacrificial material. The height of the stack (i.e., the number of layers in the stack) can be varied depending on the particular application, and the present techniques are in no way intended to be limited to the given number of layers depicted in the figures. Once the stack is completed, an oxide layer is formed on top of the stack. See FIG. 8. This oxide layer acts as a capping layer for the stack and helps to protect the stack during subsequent processing steps.

The goal will be next to pattern the stack with at least one feature, such as a pinhole or trench. To do so, a patterned hardmask (HM) is next formed on the stack marking the footprint and location of the feature(s). See FIG. 9. As described above, a pinhole through the stack can serve as the basis for forming a pinhole support structure whereas a trench can be used to form an I-beam support.

The hardmask HM is then used to pattern the feature(s) in the stack. See FIG. 10. The features shown in the figures are meant to generically represent a pinhole or trench having been formed in the stack. The feature can be patterned in a number of ways. For example, one can simply use a non-selective etchant to complete the feature etch in a single step. Alternatively, one can instead employ sequential Si- and SiGe-selective etching steps to pattern the feature(s). In each step, the underlying layer in the stack can serve as an etch stop.

After patterning the feature(s), the hardmask HM is removed and the feature(s) are filled with the material being used to form the support structure. As provided above, the support structure material might be the same as the active channel material. For instance, for a Si or SiGe active channel material, the support structure can be formed from Si or SiGe as well. See, for example, FIGS. 11-13. Upon selective removal of the sacrificial layers from the stack, the (channel material) support structure will remain as a pillar or beam supporting the suspended layers. An insulator, such as an oxide, may also be used as the support structure material. See, for example, FIG. 14. Again, upon removal of the sacrificial layers from the stack, the (insulator) support structure will remain as a pillar or beam supporting the suspended layers.

Figure 11:
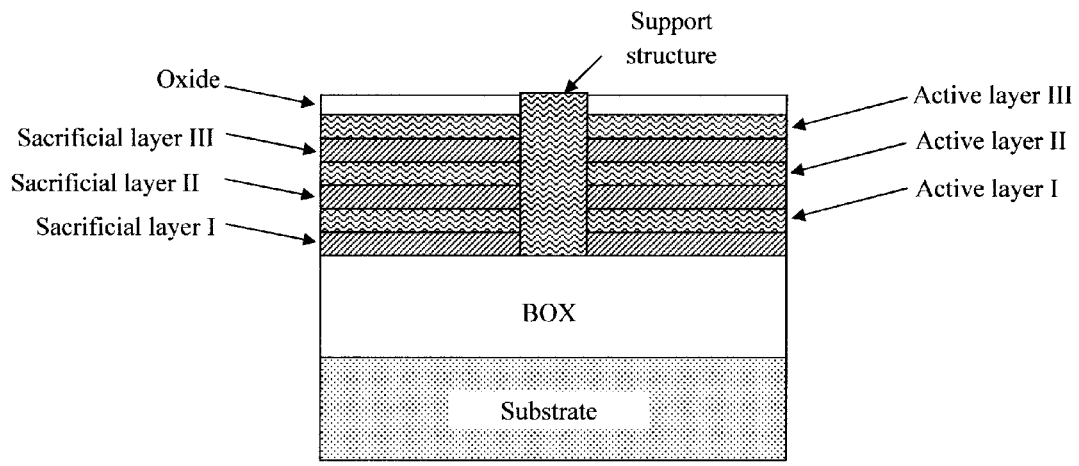
FIG. 11 is a cross-sectional diagram illustrating the feature having been filled with the active material according to an embodiment of the present invention.
Figure 12:
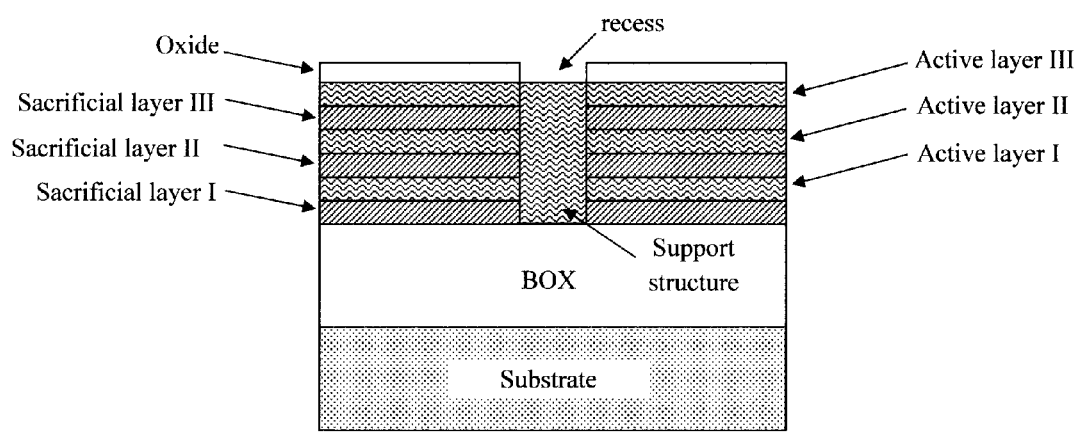
FIG. 12 is a cross-sectional diagram illustrating the active material having been recessed according to an embodiment of the present invention.
Figure 13:
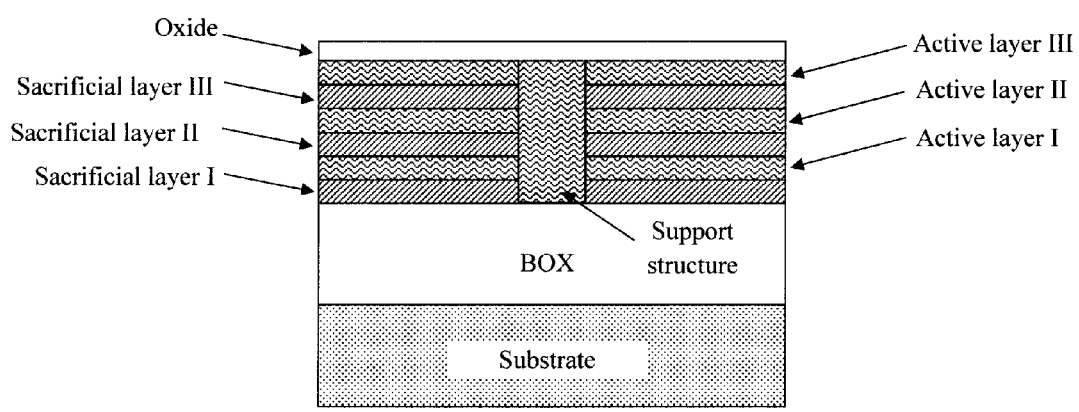
FIG. 13 is a cross-sectional diagram illustrating an oxide having been deposited into the recess according to an embodiment of the present invention.

An example using an active channel material for forming the supporting structure is shown illustrated in FIGS. 11-13. For instance, as shown in FIG. 11, the feature is filled with the same active channel material as the Active layers I, II, III, etc. For instance, the feature is filled with Si or SiGe when the active channel material is Si or SiGe, respectively. Any excess fill can be removed via a process such as chemical mechanical polishing or CMP. See FIG. 11. Further recess of the fill material as shown in FIG. 12, and deposition of an oxide into the recess can be used to provide an oxide cap over the stack and support structure as shown in FIG. 13. An oxide cap can serve to protect the stack during subsequent processing steps.

Figure 14:
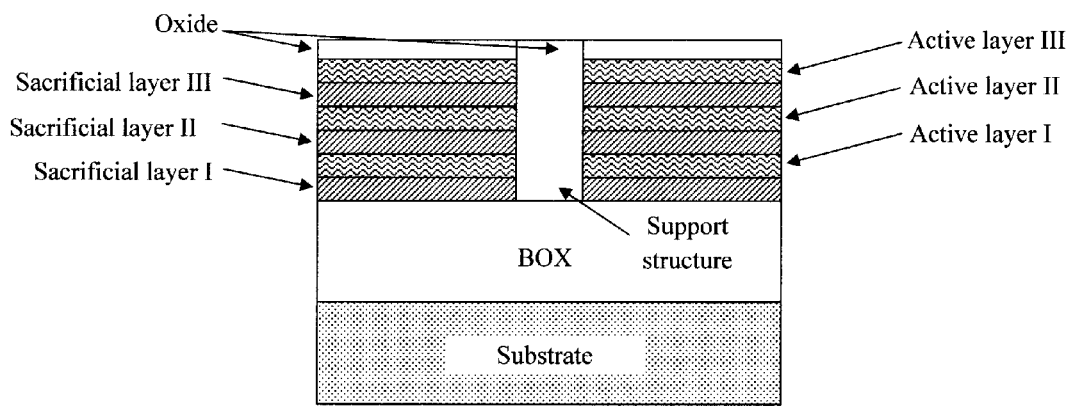
FIG. 14 is a cross-sectional diagram illustrating, as an alternative embodiment, the feature having been filled with an insulator to form the support structure according to an embodiment of the present invention.

Alternatively, as provided above, an insulator may be used to form the support structure. See FIG. 14. It is assumed that the feature has been formed in the stack using the above-described process. Thus, what is shown in FIG. 14 follows from FIG. 10. Advantageously, forming the structure from an insulator means that the support itself is electrically inactive. Thus shorting between the active channel layers by the support structure can be avoided. However, since the support structure extends through each of the active channel layers, then care must be taken to configure the shape/size of the support structure so as not to interrupt the current flow in the active channel layers between the source (S) and the drain (D) (see, for example, FIGS. 1 and 4, described above).

As shown in FIG. 14, the feature is filled with an insulator, such as an oxide (e.g., silicon dioxide ($SiO_2$). Any overfill can be removed via a process such as CMP.

As highlighted above, the present techniques may be integrated into a process for forming a transistor device. See, for example, FIGS. 15-21. For illustrative purposes only, the process is depicted in the figures using the (above-described) support structure having been formed from the active channel material. However, the process would proceed in the same manner had the support structure been formed from an insulator (as described above). Further, in the following example, a gate last approach is used whereby a sacrificial or dummy gate is placed over the channel region of the device early on in the process. The dummy gate serves as a placeholder and permits the placement of the source and drain regions of the device. Following formation of the source and drain regions, the dummy gate can be removed and replaced with a replacement gate stack. Thus, potential damage to the replacement gate stack (e.g., from processing conditions such as during dopant implants and/or activation anneals) can be avoided since the replacement gate stack is not formed until the end of the process.

Figure 15:
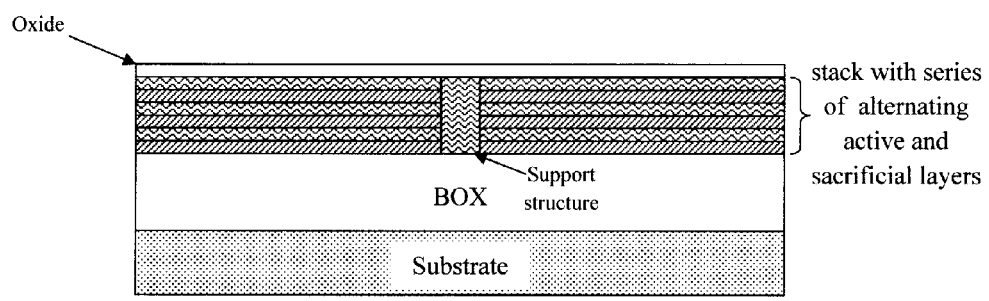
FIG. 15 is a cross-sectional diagram illustrating a starting structure for an exemplary methodology for forming a transistor device according to an embodiment of the present invention.
Figure 16:
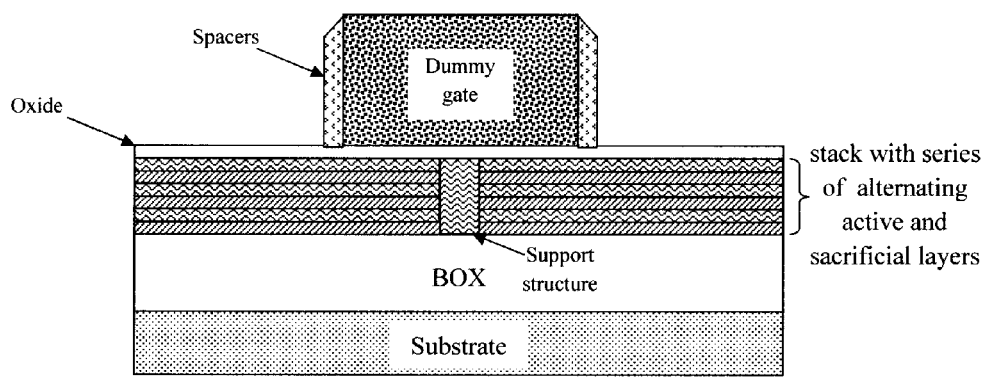
FIG. 16 is a cross-sectional diagram illustrating a dummy gate having been formed over a portion of the stack that will serve as a channel region of the transistor device and dummy gate spacers having been formed on opposite sides of the dummy gate according to an embodiment of the present invention.
Figure 17:
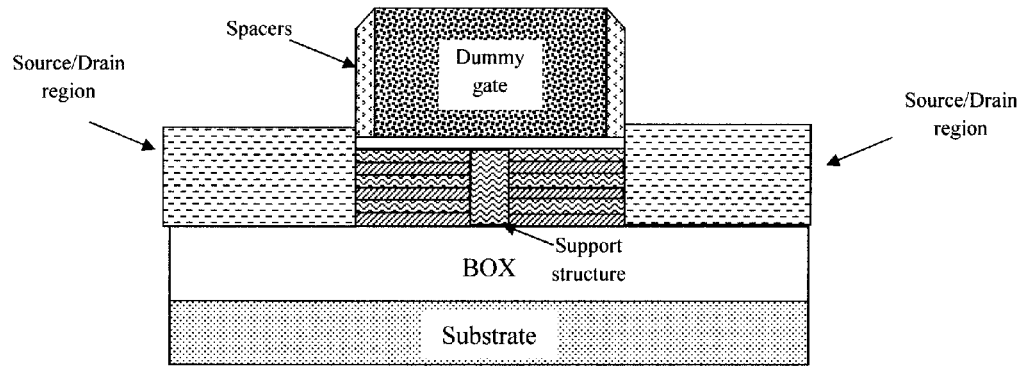
FIG. 17 is a cross-sectional diagram illustrating source and drain regions of the transistor device having been formed on opposite sides of the dummy gate according to an embodiment of the present invention.

Beginning as shown in FIG. 15 with the active channel and sacrificial layer stack and support structure having been formed in the stack, the next task is to form the dummy gate over a portion of the stack that will serve as a channel region of the transistor device. See FIG. 16. By way of example only, the dummy gate can be formed by blanket depositing a suitable dummy gate material onto the stack, and then patterning the dummy gate material into at least one individual dummy gate. Suitable dummy gate materials include, but are not limited to, poly-silicon (poly-Si). Preferably, dummy gate spacers are next formed on opposite sides of the dummy gate. These dummy gate spacers offset the gate from what will be the source and drain regions of the device.

Now that the dummy gate is in place, the source and drain regions of the transistor device can be formed. See FIG. 17. According to an exemplary embodiment, the source and drain regions of the transistor device are formed by removing the stack outside of the channel region (i.e., the channel region is covered by the dummy gate) and growing the source and drain regions on the sides of the cut stack (i.e., on opposite sides of the dummy gate) from an in-situ doped epitaxial material such as in-situ doped epitaxial Si, silicon carbide (SiC), or SiGe. Suitable n-type dopants include but are not limited to phosphorous (P), and suitable p-type dopants include but are not limited to boron (B). Alternatively, an ex-situ process such as ion implantation may be employed to introduce dopants into the source and drain regions of the transistor device.

Figure 18:
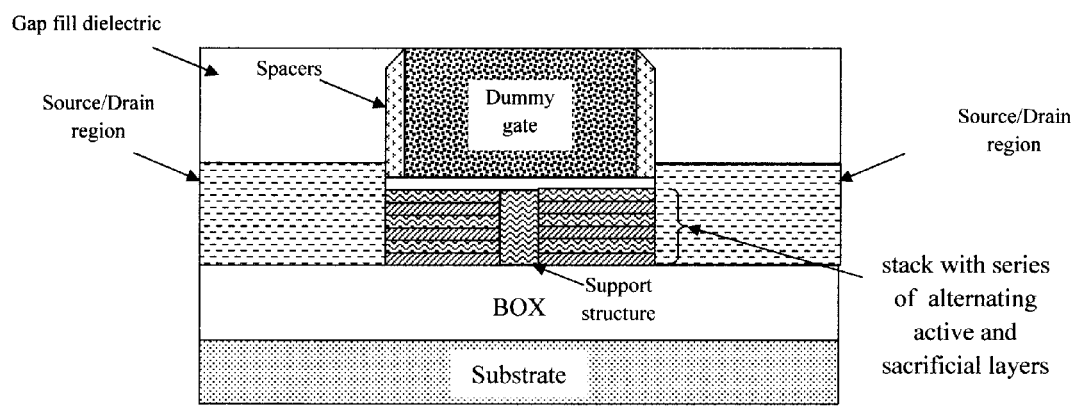
FIG. 18 is a cross-sectional diagram illustrating the dummy gate having been buried in a gap fill dielectric material according to an embodiment of the present invention.

Next, as shown in FIG. 18, the dummy gate is buried in a gap fill dielectric material. This will permit removal of the dummy gate from the channel region of the transistor device, release of the active channel layers from the stacks, and the formation of a (e.g., gate-all-around GAA) replacement gate in place of the dummy gate. Any excess gap fill dielectric covering the dummy gate can be removed, e.g., using CMP, such that the top of the dummy gate is exposed as shown in FIG. 18.

Figure 19:
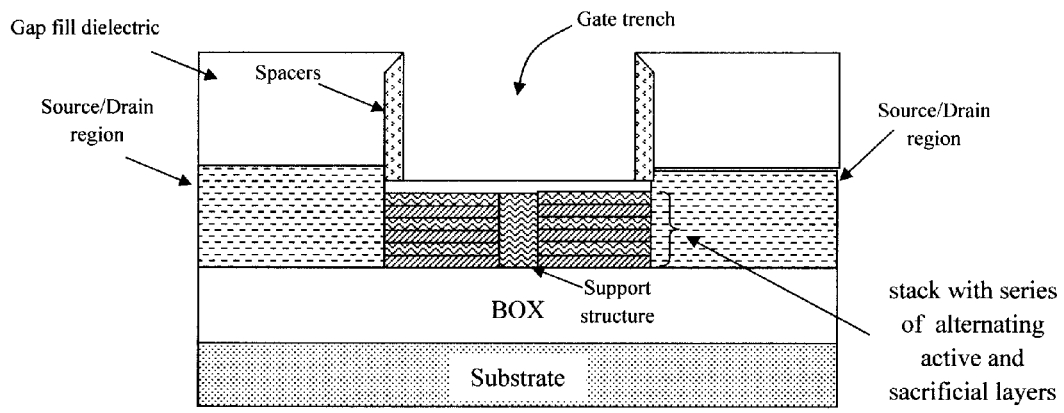
FIG. 19 is a cross-sectional diagram illustrating the dummy gate having been removed thereby forming a trench in the gap fill dielectric material and exposing the portion of the stack in the channel region of the transistor device according to an embodiment of the present invention.

As shown in FIG. 19, the dummy gate is then removed selective to the gap fill dielectric material and the dummy gate spacers, thereby forming a gate trench in the gap fill dielectric material and exposing the portion of the stack in the channel region of the transistor device. As provided above, when the dummy gate is formed from poly-Si a poly-Si-selective etching process can be employed to remove the dummy gate selective to the gap fill dielectric material and the spacers.

The sacrificial layers are next removed from the stack (selective to the active channel layers) in the channel region of the transistor device. See FIG. 20. Removing the sacrificial layers serves to release the active channel layers from the stack in the channel region of the device. Fully released active channel layers permits the replacement gate (to be formed later in the process—see below) to fully surround a portion of each of the active channel layers in a GAA configuration. Releasing the active channel layers from the stack effectively suspends these layers in the channel region of the transistor device. As noted above, without support these suspended layers can undesirably sag. If the sagging is severe enough, the layers can even come in contact with one another. Advantageously, with the present techniques, the support structure (pin-hole column or beam) is formed from a material that is resistant to the release etch (e.g., the active channel material or an insulator) and thus remains in place after the sacrificial layers have been removed. See FIG. 20. As such, the active layers are supported in their span and sagging is minimized or eliminated.

In the example described above, the active/sacrificial layers were Si and SiGe where either material can serve as the active or sacrificial material for the other. In the case of a Si active channel material and SiGe sacrificial material, the SiGe layers can be removed from the stack as follows: a chemical etchant can be employed that exploits the lower oxidation potential of the SiGe layers as compared to the Si layers. Examples of such etchants include, but are not limited to a 1:2:3 mixture of hydrofluoric acid (HF):hydrogen peroxide ($H_2O_2$):acetic acid ($CH_3COOH$), or a mixture of sulfuric acid ($H_2SO_4$) and $H_2O_2$. Alternatively, the SiGe layers can be selectively removed using a dry etching process, such as hydrogen baking at a temperature of from about 500° C. to about 700° C., and ranges therebetween, carried out for example in a conventional epitaxial reactor. Conversely, TMAH (Tetra-Methyl-Ammonium Hydroxide) etches Si more rapidly than SiGe, and so may be used to selectively remove Si sacrificial layers while retaining SiGe active layers.

Figure 20:
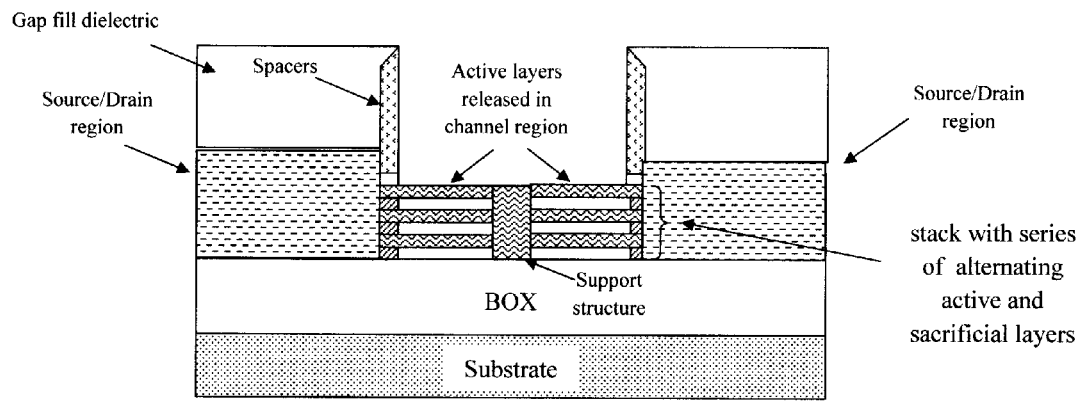
FIG. 20 is a cross-sectional diagram illustrating the sacrificial layers having been removed from the stack selective to the active channel layers according to an embodiment of the present invention.

In the present example, as shown in FIG. 20, the stack remains pinned to the source and drain regions, i.e., the release etch is only performed in the channel region. Thus, the suspended active channel layers are anchored at opposite ends thereof to the source and drain regions of the transistor device.

Figure 21:
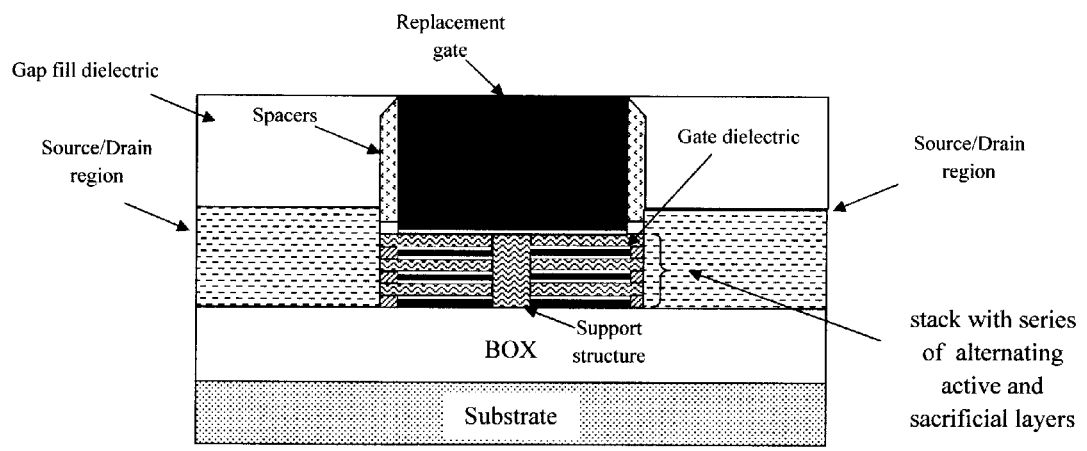
FIG. 21 is a cross-sectional diagram illustrating a replacement gate having been formed in the gate trench according to an embodiment of the present invention.

As shown in FIG. 21, a replacement gate can then be formed in the gate trench. The replacement gate surrounds a portion of each of the active channel layers in a GAA configuration. According to an exemplary embodiment, the replacement gate is a metal gate and the present process flow is a replacement metal gate process. Prior to placing the replacement gate, a gate dielectric is preferably formed on the active layers, so as to separate the active layers from the replacement gate. By way of example, in the case of a metal gate, a suitable gate dielectric includes high-κ materials such as hafnium oxide ($HfO_2$) and lanthanum oxide ($La_2O_3$). The term "high-κ" as used herein refers to a material having a relative dielectric constant κ which is much higher than that of silicon dioxide (e.g., a dielectric constant κ=25 for hafnium oxide rather than 4 for silicon dioxide).

To form the replacement gate, a gate material or combination of materials is/are then deposited into the gate trench on the gate dielectric. By way of example only, in the case of a metal gate, a combination of gate metals may be used. For instance, a workfunction setting metal layer may be deposited onto the gate dielectric, followed by a filler metal layer. Suitable workfunction setting metals include, but are not limited to, n-type workfunction setting metals such as titanium nitride (TiN) and tantalum nitride (TaN), and p-type workfunction setting metals such as tungsten (W). Suitable filler metals include, but are not limited to, aluminum (Al). The replacement gate is now formed. Any further processing, if so desired, can be performed to complete the device.

Figure 22:
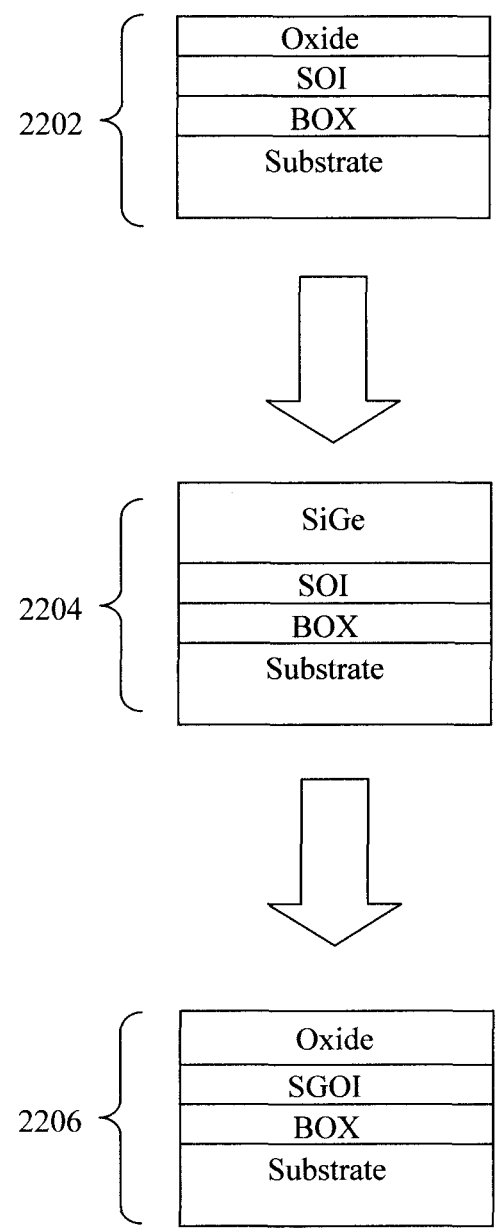
FIG. 22 is a diagram illustrating an exemplary germanium condensation process for forming a silicon germanium-on-insulator (SGOI) wafer according to an embodiment of the present invention.

As provided above, Ge condensation can be used to form a SGOI wafer as a starting platform for the present process when one wishes to use SiGe as the active channel material. FIG. 22 provides an exemplary methodology which may be employed to form the starting SGOI wafer. The process begins in step 2202 with a SOI wafer. As described above, an SOI wafer has a SOI layer separated from a substrate by a buried insulator (e.g., a BOX when the buried insulator is an oxide). By way of example only, one can start with a commercially available SOI wafer and, as shown in step 2202, the SOI layer can be thinned, if necessary. Namely, thinning of the SOI layer can be carried out using oxidation and oxide stripping steps which can be repeated until a desired thickness of the SOI layer is achieved. According to an exemplary embodiment, the SOI layer is thinned to a thickness of from about 5 nm to about 20 nm, and ranges therebetween.

Once the final oxide is stripped from the SOI, in step 2204 an epitaxial SiGe layer is grown on the SOI. Ge condensation via an oxidation process is then used to repel Ge atoms from the SiGe layer into the SOI layer. See step 2206. For instance, during oxidation of the SiGe layer the Si atoms become oxidized (forming silicon oxide—labeled "oxide" in step 2206), and the Ge atoms from the SiGe layer are repelled into the underlying SOI, forming SGOI on the BOX. This SGOI can then be used as the first layer in the above-described Si/SiGe stack. Although an embodiment in SOI is shown, a bulk wafer may also be used.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a device structure, the method comprising:
   forming a series of alternating active and sacrificial layers as a stack on a substrate;
   patterning at least one feature through each of the active and sacrificial layers in the stack, wherein the active layers comprise a channel material and serve as a channel region between a source and a drain, and wherein the feature is patterned through only a middle of each of the active layers with the channel material fully surrounding the feature in each of the active layers such that current flow through the channel region is uninterrupted by the feature patterned through each of the active layers;
   filling the feature with a fill material that is resistant to etching performed on the sacrificial layers; and
   etching the sacrificial layers within the channel region to selectively remove the sacrificial layers from between the active layers in the channel region thereby suspending the active layers, wherein following the etching the fill material remains as a structure supporting the suspended active layers.

2. The method of claim 1, wherein the active layers comprise silicon and the sacrificial layers comprise silicon germanium.

3. The method of claim 1, wherein the active layers comprise silicon germanium and the sacrificial layers comprise silicon.

4. The method of claim 1, wherein the feature comprises a pinhole.

5. The method of claim 4, wherein the pinhole has a diameter d of from about 5 nanometers to about 15 nanometers, and ranges therebetween.

6. The method of claim 1, wherein the feature comprises a trench.

7. The method of claim 6, wherein the trench has a width w of from about 5 nanometers to about 15 nanometers, and ranges therebetween.

8. The method of claim 1, wherein the fill material comprises a same material as the active layers.

9. The method of claim 1, wherein the fill material comprises an insulator.

10. The method of claim 9, wherein the insulator is an oxide.

11. The method of claim 1, further comprising:
    forming a hardmask on the stack patterned with the footprint and location of the feature.

12. A method of forming a transistor device, comprising:
    forming a series of alternating active and sacrificial layers as a stack on a substrate;
    patterning at least one feature through each of the active and sacrificial layers in the stack;
    filling the feature with a fill material that is resistant to etching performed on the sacrificial layers;
    forming a dummy gate over a portion of the stack that serves as a channel region of the transistor device;
    forming source and drain regions on opposite sides of the dummy gate;
    burying the dummy gate in a gap fill dielectric;
    removing the dummy gate forming a gate trench in the gap fill dielectric;
    etching the sacrificial layers within the gate trench to selectively remove the sacrificial layers from between the active layers in the channel region thereby suspending the active layers in the channel region of the transistor device, wherein following the etching the fill material remains as a structure supporting the suspended active layers in the gate trench; and
    forming a replacement gate in the gate trench.

13. The method of claim 12, further comprising:
    forming dummy gate spacers on opposite sides of the dummy gate.

14. The method of claim 12, wherein the active layers comprise silicon and the sacrificial layers comprise silicon germanium.

15. The method of claim 12, wherein the active layers comprise silicon germanium and the sacrificial layers comprise silicon.

16. The method of claim 12, wherein the feature comprises a pinhole.

17. The method of claim 12, wherein the feature comprises a trench.

18. The method of claim 12, wherein the fill material comprises a same material as the active layers.

19. The method of claim 12, wherein the fill material comprises an insulator.

* * * * *